United States Patent [19]

Nakamura et al.

[11] Patent Number: 4,866,293
[45] Date of Patent: Sep. 12, 1989

[54] PHOTOELECTRIC CONVERTING APPARATUS TO PREVENT THE OUTFLOW OF EXCESS CARRIERS

[75] Inventors: Yoshio Nakamura; Shigetoshi Sugawa, both of Atsugi, Japan

[73] Assignee: Canon Kabushiki Kaisha, Tokyo, Japan

[21] Appl. No.: 128,949

[22] Filed: Dec. 4, 1987

[30] Foreign Application Priority Data

Dec. 9, 1986 [JP] Japan ............................ 61-291589
Dec. 9, 1986 [JP] Japan ............................ 61-291590
Jan. 16, 1987 [JP] Japan ............................ 62-006253

[51] Int. Cl.$^4$ ............................................. H01J 40/14
[52] U.S. Cl. ............................. 250/578; 358/213.19
[58] Field of Search ................... 250/211 J, 578; 357/30 H; 358/213.19

[56] References Cited

U.S. PATENT DOCUMENTS

| 4,500,924 | 2/1985 | Ohta | 358/213.19 |
|---|---|---|---|
| 4,611,223 | 9/1986 | Hine et al. | 357/30 |
| 4,686,554 | 8/1987 | Ohmi | 357/30 |
| 4,688,098 | 8/1987 | Kon et al. | 358/213.19 |
| 4,712,138 | 12/1987 | Kyuma et al. | 358/213.31 |
| 4,751,559 | 1/1988 | Sugawa et al. | 357/30 |
| 4,760,435 | 7/1988 | Burt | 358/213.19 |

FOREIGN PATENT DOCUMENTS 253678 1/1988 European Pat. Off. .

Primary Examiner—David C. Nelms
Assistant Examiner—William L. Oen
Attorney, Agent, or Firm—Fitzpatrick, Cella, Harper & Scinto

[57] ABSTRACT

There is a photoelectric converting apparatus having a photoelectric converting cell of the type in which by controlling the potential of a control electrode region of a semiconductor transistor, the carriers generated in the control electrode region by the light excitation are accumulated, and the accumulation voltage generated by this accumulation is read out from one of the main electrode regions of the semiconductor transistor. The control electrode region is connected to an excess carrier eliminating circuit to perform the switching operation in dependence on the potential difference across the control electrode region.

32 Claims, 12 Drawing Sheets

PHOTOELECTRIC CONVERTING APPARATUS TO PREVENT THE OUTFLOW OF EXCESS CARRIERS

FIELD OF THE INVENTION

The present invention relates to a photoelectric converting apparatus of the system in which the carriers generated in the control electrode region of a transistor by light excitation are accumulated and, more particularly, to a photoelectric converting apparatus to prevent the outflow of the excess carriers.

RELATED BACKGROUND ART

FIG. 1A shows a schematic cross sectional view of a photoelectric converting apparatus and FIG. 1B is a diagram showing an equivalent circuit of one of the photoelectric converting cells in this apparatus.

In FIG. 1A, an n⁻ epitaxial layer 4 is formed on an n silicon substrate 1. Photoelectric converting cells which are electrically insulated from one another by a device separating region 6 are arranged in the layer 4.

First, a p base region 9 of a bipolar transistor is formed on the n⁻ epitaxial layer 4. An n⁺ emitter region 15 is formed in the p base region 9. Further, a capacitor electrode 14 to control the potential of the p base region 9 and an emitter electrode 19 connected to the n⁺ emitter region 15 are formed through an oxide film 12, respectively.

An electrode 17 connected to the capacitor electrode 14 is formed. An n⁺ region 2 for ohmic contact is formed on the back side of the substrate 1. A collector electrode 21 of the bipolar transistor is formed under the n⁺ region 2. In this manner, a photoelectric converting cell is constructed.

The fundamental operation of the photoelectric converting cell will now be described. First, the p base region 9 which is biased to the negative potential is set into the floating state. The holes in the electron/hole pairs generated by the light excitation are accumulated into the p base region 9 (accumulation operation).

Subsequently, the positive voltage is applied to the capacitor electrode 14, thereby forwardly biasing the circuit between the emitter and the base. The accumulated voltages generated by the holes accumulated are read out to the emitter side in the floating state (readout operation).

Then, the emitter side is grounded and pulses of the positive voltage are applied to the capacitor electrode 14, thereby extinguishing the holes accumulated in the p base region 9. Thus, when the positive voltage pulse for refreshing falls, the p base region 9 is reset to the initial state (refresh operation).

In such a photoelectric converting apparatus, after the accumulated charges were amplified by the amplifying function of each cell, they are read out, so that the high output, high sensitivity, and low noise can be accomplished. On the other hand, since the structure is simple, this apparatus is also advantageous to realize the high resolution in future.

However, when a photoelectric converting apparatus is constructed by arranging a plurality of photoelectric converting cells mentioned above, there is a problem such that in the case where a saturation light amount or more is irradiated onto a certain pixel, smearing occurs. Namely, when the intense light enters, a large quantity of holes are accumulated in the p base region 9, so that the base potential increases. When the base potential increases to a value in excess of the collector potential, a depletion layer 22 between the base and the collector is extinguished and the accumulated carriers in the base flow into the adjacent cells (as indicated by arrows 23). Thus, the p base region 9 of the adjacent cells enters the accumulation state in which the inflow holes were added. When an image of the readout signal is reproduced, smearing occurs.

On the other hand, when a long sensor is formed using the photoelectric converting cells, in the case of the configuration of the conventional photoelectric converting apparatus, there are problems such that the refresh operation conditions differ in every cell, and this results in the occurrence of the fixed pattern noise, variation in sensitivity, and the like.

SUMMARY OF THE INVENTION

The present invention intends to solve the foregoing conventional problems and it is an object of the invention to provide a photoelectric converting apparatus which can prevent smearing or the like and can obtain an accurate output signal.

Another object of the invention is to provide a photoelectric converting apparatus which can reduce the fixed pattern noise and variation in sensitivity.

According to an embodiment of the present invention, the above objects are accomplished by a photoelectric converting apparatus having a photoelectric converting cell of the type in which by controlling the potential of a control electrode region of a semiconductor transistor, the carriers generated in the control electrode region by the light excitation are accumulated and the accumulated voltage generated by the carrier accumulation is read out from one of the main electrode regions of the semiconductor transistor, wherein the control electrode region is connected to excess carrier eliminating means for performing the switching operation in accordance with the potential difference across the control electrode region.

The excess carriers accumulated by the control electrode region can be automatically eliminated by the excess carrier eliminating means, so that the outflow of the excess carriers into the adjacent cells is prevented and the occurrence of smearing of the reproduced image can be prevented.

According to another embodiment of the invention, the foregoing objects are accomplished by a photoelectric converting apparatus having a plurality of photoelectric converting cells each of which has a semiconductor transistor and switching means for clamping the potential of a control electrode region of the semiconductor transistor to a constant value and performs the accumulation operation t accumulate the carriers generated in the control electrode region by the light excitation by controlling the potential of the control electrode region, the readout operation to read out the accumulated voltages generated by the carrier accumulation, and the refresh operation to extinguish the carriers in the control electrode region after clamping the potential of the control electrode region to a constant potential by the switching means, wherein the switching means of arbitrary one of the photoelectric converting cells is controlled at the refresh operation timing of the cell before this arbitrary cell, and the potential of the control electrode region is clamped to a constant value.

In this manner, since the control electrode region of the post cell is clamped to a constant potential at the refresh operation timing of the preceding cell, the time intervals from the clamping operation until the refresh operation regarding all of the photoelectric converting cells are the same. Therefore, the refresh operation conditions are the same. The generation of the fixed pattern noise, variation in sensitivity, and the like are prevented.

According to still another embodiment of the invention, the foregoing objects are accomplished by a photoelectric converting apparatus comprising: a photoelectric converting transistor having a control electrode region to accumulate carriers generated by light excitation; and carrier eliminating means for limiting the potential of the control electrode region to a value within a constant potential lower than a saturation potential.

The carriers generated by light excitation are accumulated in the control electrode region. However, when the potential of the control electrode region just exceeds the constant potential, the carriers in the control electrode region are eliminated by the carrier eliminating means, so that the potential of the control electrode region is always limited to a value within the constant potential before it reaches the saturation potential. Therefore, the outflow of the carriers when the potential of the control electrode region reaches the saturation potential does not occur and the leakage of the carriers to the adjacent devices is prevented.

The above and other objects and features of the present invention will become apparent from the following detailed description and the appended claims with reference to the accompanying drawings.

DETAILED DESCRIPTION OF THE PREFERRED EMBODIMENTS

An embodiment of the present invention will be described in detail hereinbelow with reference to the drawings.

Figure 2A:
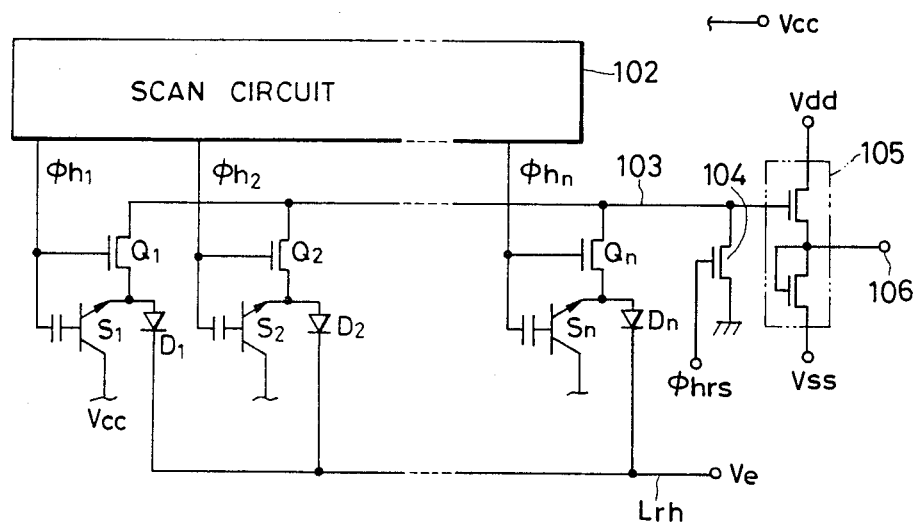
FIG. 2A is a schematic circuit diagram in the first embodiment of a photoelectric converting apparatus according to the present invention.

FIG. 2A is a schematic circuit diagram in the first embodiment of a photoelectric converting apparatus according to the invention.

Figure 1A:
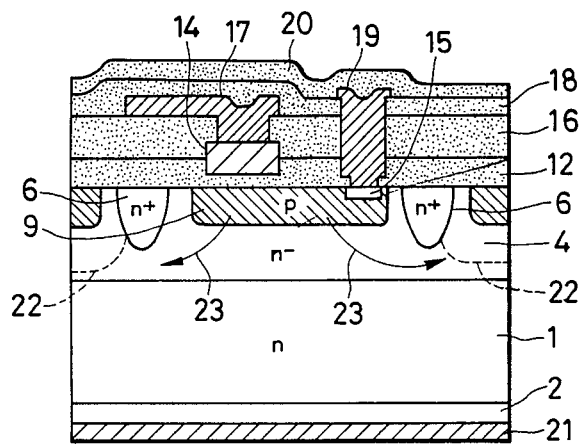
FIG. 1A is a schematic cross sectional view of a photoelectric converting cell disclosed in Japanese Laid-Open Patent Gazette Nos. 12759/1985-12765/1985.
Figure 1B:
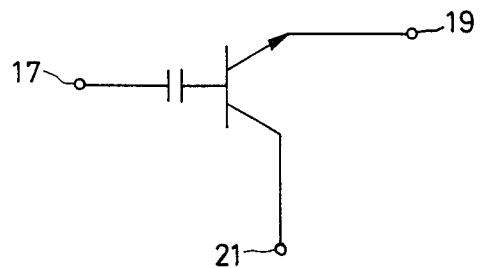
FIG. 1B is an equivalent circuit diagram of this cell.

In the diagram, photoelectric converting cells $S_1$ to $S_n$ shown in FIG. 1 are arranged in line. A constant positive voltage $V_{cc}$ is applied to the collector electrode 21 of each photoelectric converting cell. Each capacitor electrode 17 is connected to a parallel output terminal of a scan circuit 102. The photoelectric converting cells perform the readout operation or refresh operation in response to signals $\phi_{h1}$ to $\phi_{hn}$ from the output terminals, respectively.

The emitter electrodes 19 are commonly connected to an output line 103 through transistors $Q_1$ to $Q_n$, respectively. The gate electrodes of the transistors $Q_1$ to $Q_n$ are respectively connected to the parallel output terminals of the scan circuit in a manner similar to the capacitor electrodes 17. Further, the emitter electrodes 19 are connected to a constant voltage line $L_{rh}$ through PN diodes $D_1$ to $D_n$, respectively. A constant voltage $V_e$ lower than the voltage $V_{cc}$ is applied to the line $L_{rh}$. Therefore, the p base region 9 of each cell is connected to the line $L_{rh}$ through the PN junction of the p base region 9 and emitter region 15 and the PN junction of the diodes $D_1$ to $D_n$.

The output line 103 is grounded through a transistor 104 and connected to an amplifier 105. A readout signal is serially output to the outside from an output terminal 106 of the amplifier 105. A signal $\phi_{hrs}$ is supplied to the gate electrode of the transistor 104, thereby refreshing the output line 103.

The operation of the embodiment having such a configuration will now be described with reference to FIG. 2B.

Figure 2B:
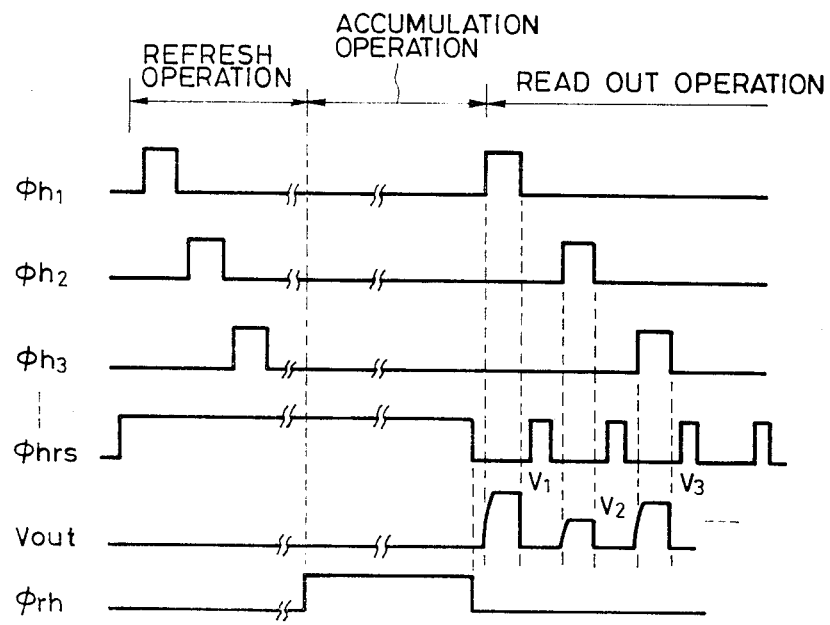
FIG. 2B is a timing chart for explaining the operation of the embodiment.

FIG. 2B is a timing chart for explaining the operation in this embodiment.

REFRESH OPERATION

First, the transistor 104 is turned on by the signal $\phi_{hrs}$ and the output line 103 is grounded. Then, the signals $\phi_{h1}$ to $\phi_{hn}$ are sequentially output from the parallel output terminals of the scan circuit.

Thus, the transistors $Q_1$ to $Q_n$ are sequentially turned on. The emitter electrodes 19 are sequentially grounded through the output line 103. At the same timings, the pulses $\phi_{h1}$ to $\phi_{hn}$ are sequentially supplied to the capacitor electrodes 17. Thus, the foregoing refresh operation is performed and the carriers accumulated in the p base region 9 are eliminated.

ACCUMULATION OPERATION

No voltage is applied to the capacitor electrodes 17 and the transistors $Q_1$ to $Q_n$ are turned off, thereby allowing the carriers of the quantity corresponding to the illuminance of the incident light to be accumulated into the p base region 9.

At this time, the strong light enters and the excess carriers (in this case, the holes) are accumulated and the base potential increases. When the base potential rises to the value which is higher than the constant voltage $V_e$ by about 1.4V, the PN junction with the line $L_{rh}$ of the constant voltage $V_e$ is set into the forward bias state. The excess carriers flow out to the line $L_{rh}$ through the PN junction between the base and the emitter and through the PN junction of the diode D.

In this manner, even if the strong light entered, the excess carriers in the base region 9 are eliminated to the line $L_{rh}$, so that the outflow of the excess carriers to the adjacent cells as in the conventional apparatus is prevented.

READOUT OPERATION

After the accumulation operation was performed for a constant period of time, the signal $\phi_{hrs}$ is set to the low level to turn off the transistor 104, thereby setting the output line 103 into the floating state.

Subsequently, the signal $\phi_{h1}$ is first output from the scan circuit. A readout pulse is supplied to the capacitor electrode 17 of the photoelectric converting cell $S_1$. Thus, the transistor $Q_1$ is turned on and the signal of the cell $S_1$ is read out to the output line 103 through the transistor $Q_1$. This signal is output as an output signal $V_1$ from the output terminal 106 through the amplifier 105.

When the output signal $V_1$ is generated, the transistor 104 is turned on by the signal $\phi_{hrs}$ and the carriers remaining in the output line 103 are eliminated.

In a manner similar to the above, the signals $\phi_{h2}$ to $\phi_{hn}$ are sequentially output from the scan circuit and the readout pulses are supplied to the capacitor electrodes 17 of the photoelectric converting cells $S_2$ to $S_n$, respectively. Each time output signals $V_2$, $V_3$, ... are output from the output terminal 106, the transistor 104 is turned on and the output line 103 is refreshed.

In this manner, the signals of the cells $S_1$ to $S_n$ are directly read out to the output line 103 through the transistors $Q_1$ to $Q_n$ and transferred to the outside through the amplifier 105. Thus, the high output signals of the photoelectric converting cells appear on the output line 103.

On the other hand, as shown in the diagram, since the voltage which is applied to the capacitor electrode 17 and the gate voltages of the transistors $Q_1$ to $Q_n$ are supplied by the outputs $\phi_{h1}$ to $\phi_{hn}$ from the scan circuit, the circuit constitution is simple.

Further, since the excess carriers are eliminated to the line $L_{rh}$, the occurrence of the smear of the reproduced image can be prevented.

The pulse $\phi_{rh}$ shown in FIG. 2B is the pulse which is needed in the second embodiment, which will be explained hereinafter.

Figure 3:
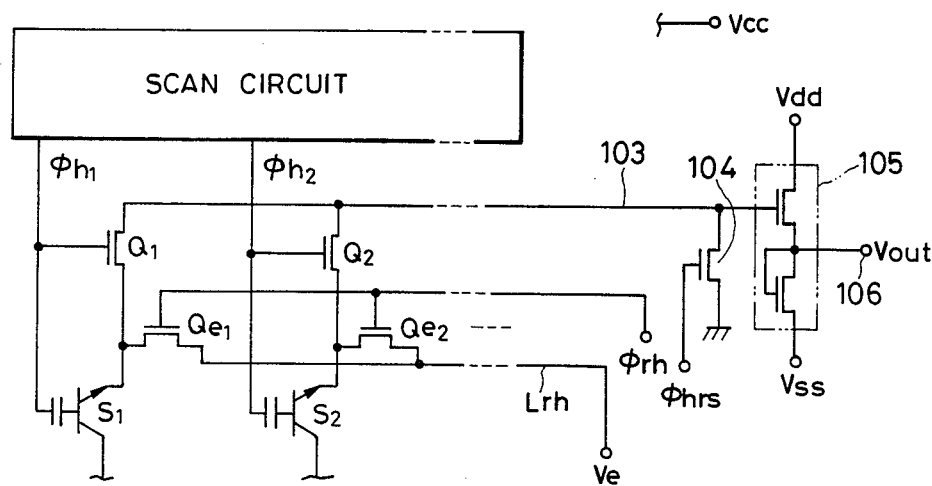
FIG. 3 is a schematic circuit diagram in the second embodiment of the invention.

FIG. 3 is a schematic circuit diagram in the second embodiment of the invention. The same circuit components as those in the first embodiment are designated by the same reference numerals and their descriptions are omitted.

In the second embodiment, the emitter electrodes 19 of the cells are connected to the constant voltage line $L_{rh}$ through the transistors $Q_{e1}$ to $Q_{en}$, respectively. The pulse $\phi_{rh}$ is applied to the gate electrodes of the transistors $Q_{e1}$ to $Q_{en}$. These transistors are made conductive when the voltage between the source and the drain of each of the transistors $Q_{e1}$ to $Q_{en}$ exceeds a constant value in the state in which the pulse $\phi_{rh}$ was applied to these transistors.

With this configuration, the photoelectric converting apparatus in this embodiment is made operative at the timings including the timing of the pulse $\phi_{rh}$ in FIG. 2. Due to this, the pulse $\phi_{rh}$ is applied to the gate electrodes of the transistors $Q_{e1}$ to $Q_{en}$ for only the period of time of the accumulation operation. The conducting state of each of the transistors $Q_{e1}$ to $Q_{en}$ in this case is determined by the potential difference between the voltage between the source and the drain, i.e., the constant voltage $V_e$ and the emitter voltage of each cell. Therefore, the excess carriers accumulated in the p base region 9 can be eliminated to the line $L_{rh}$ through the transistors $Q_{e1}$ to $Q_{en}$.

A photoelectric converting cell which is used in the third embodiment of the invention will now be explained.

Figure 4A:
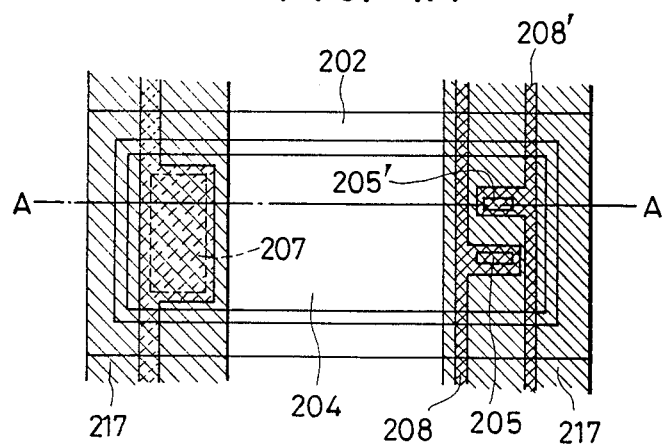
FIG. 4A is a schematic plan view of a photoelectric converting cell disclosed in Japanese Patent Application No. 252653/1985.
Figure 4B:
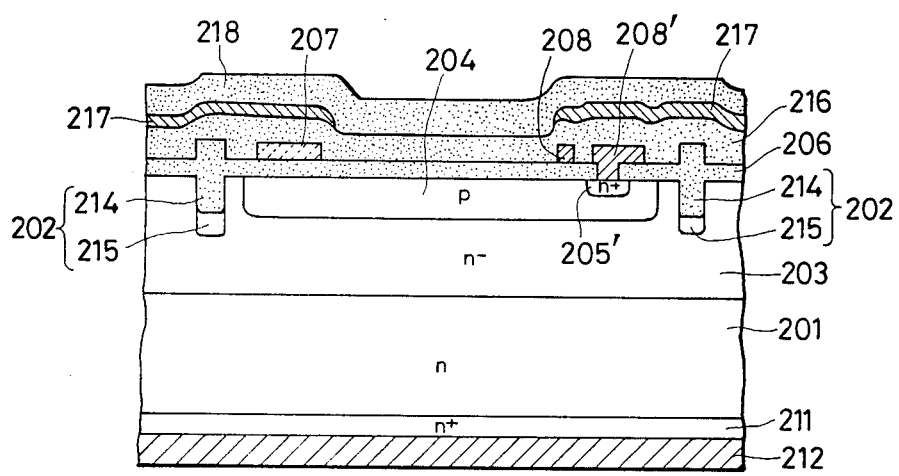
FIG. 4B is a cross sectional view taken along the line A—A in FIG. 4A.
Figure 4C:
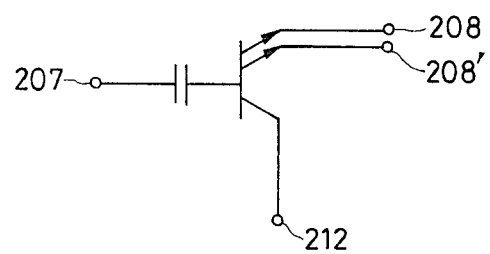
FIG. 4C is a equivalent circuit diagram of the cell in FIG. 4A.

FIG. 4A is a schematic plan view of a photoelectric converting cell disclosed in Japanese Patent Application No. 252653/1985. FIG. 4B is a cross sectional view taken along the line A—A in FIG. 4A. FIG. 4C is an equivalent circuit diagram of the cell in FIG. 4A.

In the diagrams, an n$^-$ epitaxial layer 203 is formed on an n silicon substrate 201. A p base region 204 is formed in the n$^-$ epitaxial layer 203. n$^+$ emitter regions 205 and 205' are formed in the p base region 204. Emitter electrodes 208 and 208' are connected to the n$^+$ emitter regions 205 and 205', respectively.

In this embodiment, a device separating region 202 is formed by an insulative region 214 and an n$^+$ region 215 formed just under the insulative region 214. The adjacent photoelectric converting cells are electrically isolated by the device separating region 202.

A capacitor electrode 207 is formed over the p base region 204 through an oxide film 206. Further, a light shielding film 217 is formed over the oxide film 206 through an insulative film 216. The portions in which the capacitor electrode and emitter electrode are formed are shielded against the light by the light shielding film 217. The photo sensitive surface is formed in the main section of the p base region 204. On the other hand, a protective insulative film 218 is formed on the light shielding film 217 and on the insulative film 216 serving as the photo sensitive surface.

The fundamental operations are substantially the same as those in the foregoing embodiments. First, the carriers generated by the light excitation are accumulated and the potential of the p base region 204 changes in the positive direction (accumulation operation).

Subsequently, a positive voltage pulse for readout is applied to the capacitor electrode 207. The readout signal is output from the emitter electrodes 208 and/or 208' (readout operation).

The emitter electrode is grounded and a refresh pulse of the positive voltage is applied to the capacitor electrode 207, thereby executing the refresh operation.

In the photoelectric converting cell having such a double emitter structure, one emitter can be used to read out the signal and the other emitter can be used to eliminate the excess carriers as will be explained hereinlater.

Figure 5:
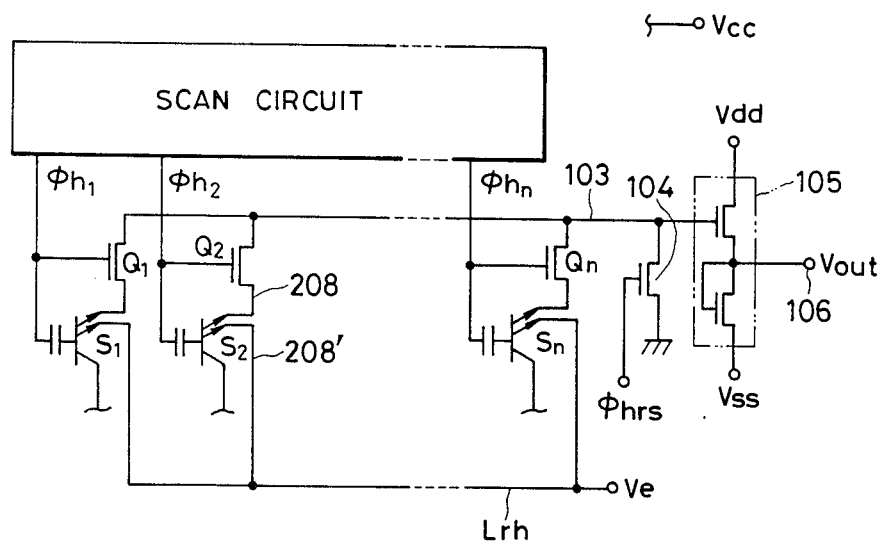
FIG. 5 is a schematic circuit diagram in the third embodiment of the invention.

FIG. 5 is a schematic circuit diagram in the third embodiment of the invention. The same circuit components as those in the first embodiment are designated by the same reference numerals and their descriptions are omitted.

In the third embodiment, one emitter electrode 208' of each cell is commonly connected to the constant voltage line $L_{rh}$ and the constant voltage $V_e$ is applied.

Thus, the voltage $V_e$ is applied to the n+ emitter region 205'. When intense light enters and the base potential rises, the excess carriers are eliminated to the line $L_{rh}$ through the PN junction of the emitter region 205'.

In each of the first to third embodiments, the case of the line sensor has been shown. However, the invention can be obviously also applied to an area sensor and the similar effects can be also obtained.

Figure 6:
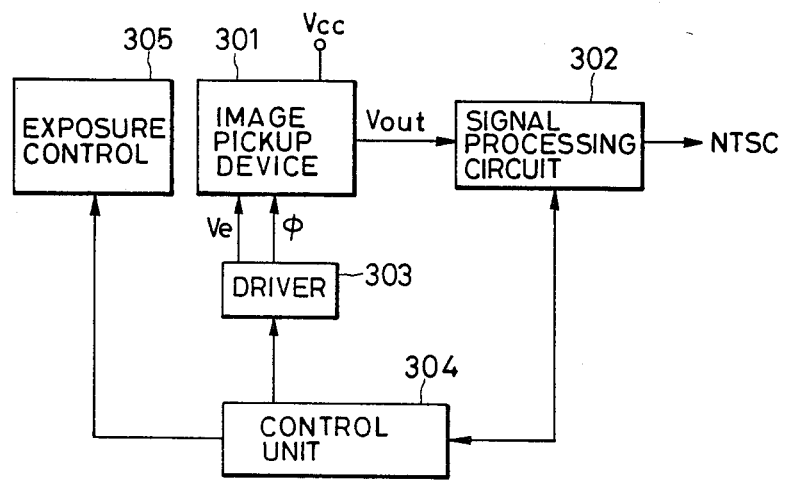
FIG. 6 is a schematic constitutional diagram of an example of an image pickup apparatus using the foregoing embodiment.

FIG. 6 is a schematic constitutional diagram of an example of an image pickup apparatus using an area sensor.

In FIG. 6, an image pickup device 301 has the constitution in each of the foregoing embodiments. An output signal $V_{out}$ of the device 301 is subjected to the processes such as gain adjustment and the like by a signal processing circuit 302 and output as a standard television signal such as an NTSC signal or the like.

On the other hand, various kinds of pulses $\phi$, voltage $V_{cc}$, and constant voltage $V_e$ to drive the image pickup device 301 are supplied from a driver 303. The driver 303 operates under the control of a control unit 304. The control unit 304 adjusts the gain and the like of the signal processing circuit 302 on the basis of an output of the image pickup device 301 and also controls an exposure control means 305, thereby adjusting the quantity of light which enters the image pickup device 301.

As explained above, the image pickup device 301 according to the invention accurately converts the information of the incident light into the electric signal, so that the image of a good quality having no smear is obtained.

As described in detail above, in the photoelectric converting apparatuses in the first to third embodiments of the invention, the excess carriers accumulated in the control electrode region of the transistor can be automatically eliminated by the excess carrier eliminating means. Therefore, the outflow of the excess carriers into the adjacent cells does not occur and the smear in the reproduced image can be prevented.

Figure 7A:
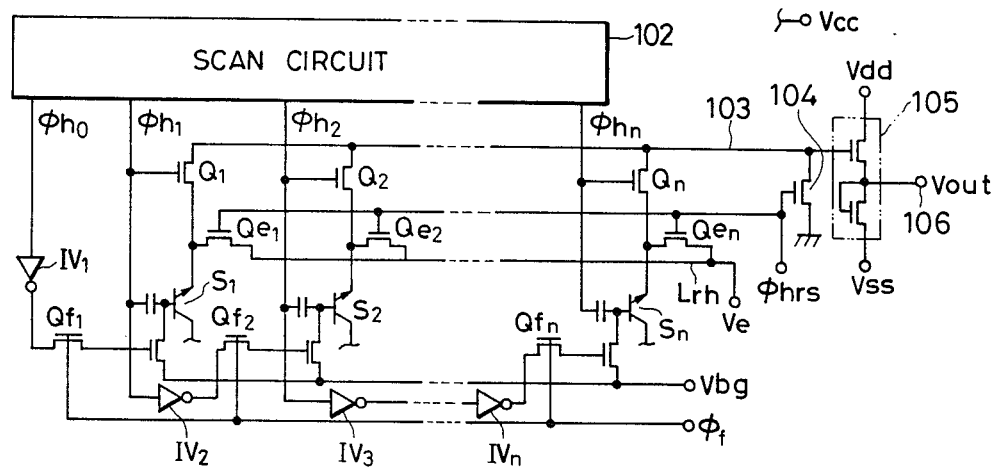
FIG. 7A is a schematic circuit diagram in the fourth embodiment of a photoelectric converting apparatus according to the invention.

FIG. 7A is a schematic circuit diagram in the fourth embodiment of a photoelectric converting apparatus according to the invention.

Figure 7B:
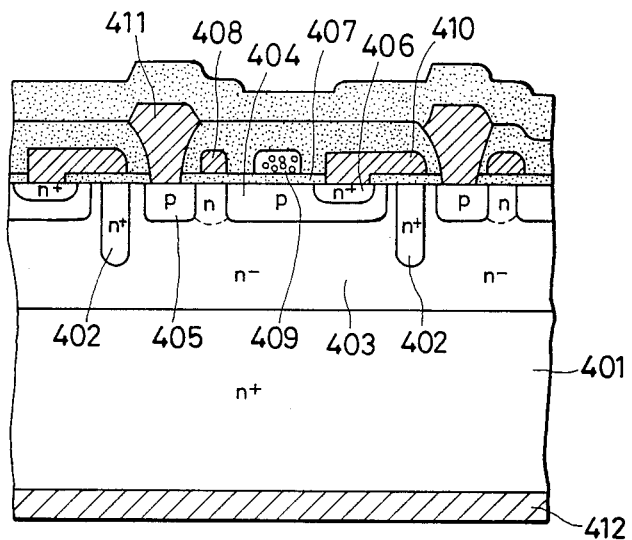
FIG. 7B is a schematic cross sectional view of a photoelectric converting apparatus having a transistor for refreshing.

In the diagram, the photoelectric converting cells $S_1$ to $S_n$ shown in FIG. 7B are arranged in line.

Figure 7C:
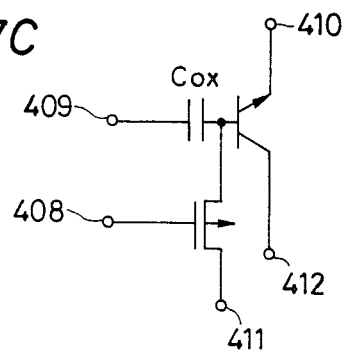
FIG. 7C is an equivalent circuit diagram of one photoelectric converting cell in the apparatus shown in FIG. 7B.
Figure 7D:
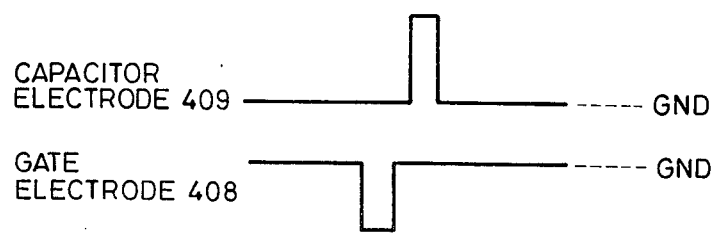
FIG. 7D is a voltage waveform diagram for explaining the refresh operation.

FIG. 7B is a schematic cross sectional view of the photoelectric converting apparatus in the fourth embodiment having a transistor for refreshing. FIG. 7C is an equivalent circuit diagram of one photoelectric converting cell in the apparatus shown in FIG. 7B. FIG. 7D is a voltage waveform diagram for explaining the refresh operation.

In FIGS. 7A and 7B, photoelectric converting cells are arranged on an n silicon substrate 401. Each cell is electrically isolated from the adjacent cells by a device separating region 402.

Each cell has the following configuration.

By doping p type impurities (e.g., boron or the like), a p base region 404 and a p region 405 are formed on an $n^-$ region 403 having a low impurity concentration which is formed by an epitaxial technique or the like. An n+ emitter region 406 is formed in the p base region 404.

The p base region 404 and p region 405 serve as a source and a drain of a p channel MOS transistor, which will be explained hereinlater.

An oxide film 407 is formed over the $n^-$ region 403 in which the foregoing regions are formed. A gate electrode 408 of the MOS transistor and a capacitor electrode 409 are formed on the oxide film 407. The capacitor electrode 409 faces the p base region 404 through the oxide film 407 and constitutes a capacitor to control the base potential.

An emitter electrode 410 connected to the n+ emitter region 406 is formed. An electrode 411 connected to the p region 405 is formed. A collector electrode 412 is formed on the back surface of the substrate 401 through an ohmic contact layer.

The operation of the foregoing photoelectric converting cell will now be explained.

The light enters from the side of the p base region 404. The carriers (in this case, the holes) corresponding to the light quantity are accumulated into the p base region 404. The base potential changes by the accumulated carriers (accumulation operation).

Next, a positive voltage pulse for readout is applied to the capacitor electrode 409, thereby increasing the base potential. The potential change by the accumulation of the carriers is read out of the emitter electrode 410. Thus, the electric signal corresponding to the incident light quantity can be obtained (readout operation).

The refresh operation to eliminate the holes accumulated in the p base region 404 will now be described.

As shown in FIG. 7D, since the MOS transistor is of the p channel transistor, it is turned on only when a negative voltage in excess of the threshold value is applied to the gate electrode 408.

To perform the refresh operation, the emitter electrode 410 is grounded and a constant voltage is applied to the electrode 411. Then, the negative voltage is applied to the gate electrode 408 to turn on the p channel MOS transistor. Thus, the potential of the p base region 404 is set to a constant value irrespective of the accumulated potential level.

Subsequently, by applying a voltage pulse for refreshing to the capacitor electrode 409, the p base region 404 is forwardly biased to the n+ emitter region 406. The accumulated holes are eliminated through the grounded emitter electrode 410. When the refresh pulse falls, the p base region 404 is reset to the initial state of the negative potential (refresh operation).

After the potential of the p base region 404 was set to the constant potential by the MOS transistor, the residual charges are erased by applying the refresh pulse as explained above. Therefore, the new accumulation operation can be executed irrespective of the preceding accumulated potential. The linearity of the photoelectric converting characteristic can be improved. The problem of the occurrence of an after image can be solved. Further, since the residual charges can be promptly extinguished, the high speed operation can be performed.

The accumulation, readout, and refresh operations are repeated in a manner similar to the above.

Returning to FIG. 7A, the constant positive voltage $V_{cc}$ is applied to the collector electrode 412 of each photoelectric converting cell. The capacitor electrodes 409 are connected to the parallel output terminals of the scan circuit 102, respectively. The photoelectric converting cells perform the readout operation or refresh operation by the signals $\phi_{h1}$ to $\phi_{hn}$ from the parallel output terminals, respectively. A constant voltage $V_{bg}$ is applied to the electrode 411 of the refreshing transistor of each cell. The output pulses $\phi_{h0}$ to $\phi_{hn-1}$ of the scan circuit 102 are applied to the gate electrodes 408 through transistors $Q_{f1}$ to $Q_{fn}$ and inverters $IV_1$ to $IV_{n'}$ respectively. A pulse $\phi_f$ is commonly supplied to the gate electrodes of the transistors $Q_{f1}$ to $Q_{fn}$.

Therefore, by turning on the transistors $Q_{f1}$ to $Q_{fn}$ by the pulse $\phi_f$, the base clamping operation of each cell can be sequentially executed at the timing of the one-preceding cell in response to the pulses $\phi_{h0}$ to $\phi_{hn-1}$ from the scan circuit 102. The foregoing refresh operation can be sequentially executed by the subsequent pulses $\phi_{h1}$ to $\phi_{hn}$.

On the other hand, the emitter electrodes 410 are commonly connected to the output line 103 through the transistors $Q_1$ to $Q_n$. The gate electrodes of the transistors $Q_1$ to $Q_n$ are connected to the output terminals of the scan circuit 102 in a manner similar to the capacitor electrodes 409. Further, the emitter electrodes 410 are connected to the constant voltage line $L_{rh}$ through the transistors $Q_{e1}$ to $Q_{en}$, respectively. The constant voltage $V_e$ lower than the voltage $V_{cc}$ is applied to the line $L_{rh}$.

The pulse $\phi_{hrs}$ is applied to the gate electrodes of the transistors $Q_{e1}$ to $Q_{en}$. These transistors execute the ON/OFF operations at the timing of the pulse $\phi_{hrs}$.

The output line 103 is grounded through the transistor 104 and connected to the amplifier 105. The readout signal is serially output to the outside from the output terminal 106 of the amplifier 105. The signal $\phi_{hrs}$ is applied to the gate electrode of the transistor 104, thereby refreshing the output line 103.

The operation in this embodiment having such a configuration will now be explained with reference to FIG. 8.

Figure 8:
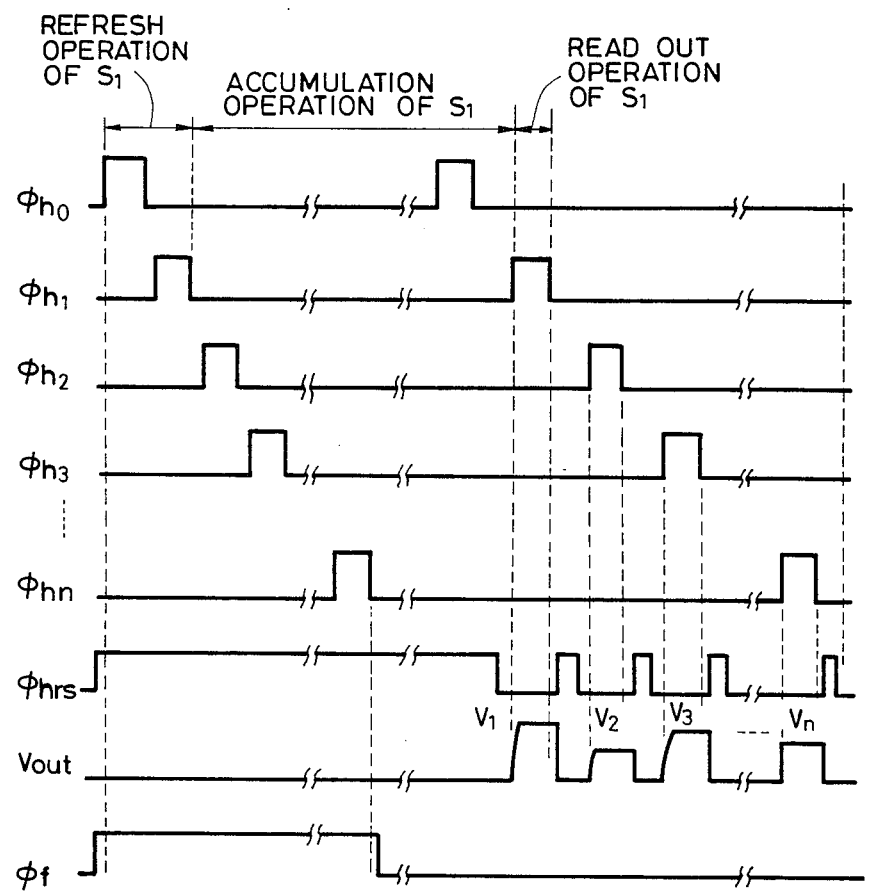
FIG. 8 is a timing chart for explaining the operation in the embodiment.

FIG. 8 is a timing chart for explaining the operation in this embodiment.

First, the transistor 104 is turned on by the signal $\phi_{hrs}$ and the output line 103 is grounded. Further, the transistors $Q_{f1}$ to $Q_{fn}$ are turned on by the pulse $\phi_f$. The pulses $\phi_{h0}$ to $\phi_{hn}$ are sequentially output from the output terminals of the scan circuit.

The pulse $\phi_{h0}$ at the high level is set to the low level by the inverter $IV_1$. This low level pulse is input to the gate electrode 408 of the refreshing transistor of the cell $S_1$ through the transistor $Q_{f1}$. Thus, the transistor is turned on. The base potential of the cell $S_1$ is clamped to the constant voltage $V_{bg}$ irrespective of the accumulated voltage level.

When the high level pulse $\phi_{h1}$ is subsequently output, the transistor $Q_1$ is turned on and the emitter electrode 410 is grounded through the output line 103 and transistor 104. Moreover, when the pulse $\phi_{h1}$ is input to the capacitor electrode 409 of the cell $S_1$, the foregoing refresh operation is executed.

At the same time, the high level pulse $\phi_{h1}$ is set to the low level by the inverter $IV_2$. This low level pulse is input to the gate electrode 408 of the refreshing transistor of the cell $S_2$ through the transistor $Q_{f2}$, so that this transistor is turned on. When the pulse $\phi_{h1}$ falls, the cell $S_1$ finishes the refresh operation and starts the accumulation operation. The base potential of the cell $S_2$ is clamped to the constant potential $V_{bg}$ irrespective of the accumulated voltage level.

In a manner similar to the above, the base clamping operation is executed at the pulse timing of the preceding cell by the pulses $\phi_{h2}$ to $\phi_{hn}$ and the refresh operation is executed at the pulse timing of the relevant cell. Upon completion of the refresh operation, the accumulation operation is sequentially started.

In this manner, since the base clamping operation and refresh operation are sequentially executed at the timings of the pulses $\phi_{h0}$ to $\phi_{hn}$, the time intervals of the base clamping operation and refresh operation in each cell are equalized. The occurrence of the fixed pattern noise and the like as in the conventional apparatus can be prevented.

When the pulse $\phi_{hn}$ falls and the refresh operation of the cell $S_n$ is finished, the pulse $\phi_f$ also falls to thereby turn off the transistors $Q_{f1}$ to $Q_{fn}$. Therefore, after that, the refreshing transistors of the cells are held in the off state irrespective of the pulses $\phi_{h0}$ to $\phi_{hn}$.

The carriers of the amount corresponding to the illuminance of the incident light are accumulated in the p base region 404 of the cell which has started the accumulation operation.

At this time, the strong light enters and the excess carriers (in this case, the holes) are accumulated and the base potential rises. When the base potential rises to a value which is higher than the constant voltage $V_e$ by about 1.4V, the PN junction with the line $L_{rh}$ of the constant voltage $V_e$ is set into the forward bias state. The excess carriers flow out to the line $L_{rh}$ through the PN junction between the base and the emitter. As explained above, even if the strong light entered, the excess carriers in the p base region 404 are eliminated to the line $L_{rh}$ and do not flow out to the adjacent cells, so that the occurrence of the smear can be prevented.

After the accumulation operation was executed for a constant period of time, the scan circuit 102 sequentially outputs the pulses $\phi_{h0}$ to $\phi_{hn}$. However, since the transistors $Q_{f1}$ to $Q_{fn}$ are in the off state, the pulse $\phi_{h0}$ is meaningless. Before the next pulse $\phi_{h1}$ is output, the pulse $\phi_{hrs}$ is set to the low level to turn off the transistor 104, thereby setting the output line 103 into the floating state.

Subsequently, by outputting the pulse $\phi_{h1}$ from the scan circuit 102, the readout pulse is applied to the capacitor electrode 409 of the cell $S_1$ and the transistor $Q_1$ is turned on. The signal of the cell $S_1$ is read out to the output line 103 through the transistor $Q_1$ and is output as an output signal $V_1$ from the output terminal 106 through the amplifier 105. Therefore, the accumulation period of time of the cell $S_1$ is equal to the time interval from the time point when the pulse $\phi_{h1}$ falls upon refresh operation until the time point when the pulse $\phi_{h1}$ rises upon readout operation.

When the output signal $V_1$ is output, the transistor 104 is turned on by the pulse $\phi_{hrs}$ and the residual carriers in the output line 103 are eliminated.

In a manner similar to the above, the readout pulses are applied to the capacitor electrodes 409 of the cells $S_2$ to $S_n$ from the scan circuit 102 at the timings of the pulses $\phi_{h2}$ to $\phi_{hn}$. The output signals $V_2$, $V_3$, ... are output from the output terminal 106. At the same time, the transistor 104 is turned on at the timing of the pulse $\phi_{hrs}$ and the output line 103 is refreshed.

The output timings of the pulses $\phi_{h0}$ to $\phi_{hn}$ of the scan circuit 102 upon refresh operation and readout operation are uniform. Thus, the accumulation period of time of each cell is the same as that of the cell $S_1$ as will be obvious from a timing chart of FIG. 8.

In this manner, since the signals of the photoelectric converting cells $S_1$ to $S_n$ are directly read out to the output line 103 through the transistors $Q_1$ to $Q_n$, the outputs of the cells appear on the output line 103 without being attenuated. Therefore, the high output signal $V_{out}$ can be derived.

On the other hand, as shown in the diagram, since the voltage which is applied to the capacitor electrode 409 and the gate voltages of the transistors $Q_1$ to $Q_n$ are supplied in response to the output pulses $\phi_{h1}$ to $\phi_{hn}$ from the scan circuit, the circuit constitution is simple.

In the above embodiment, the case where the refreshing transistor is the p channel MOS transistor has been shown. However, the invention is not limited to this case. An n channel transistor may be also formed as will be explained hereinafter. In this case, the inverters $IV_1$ to $IV_n$ in the above embodiment are unnecessary.

Figure 9A:
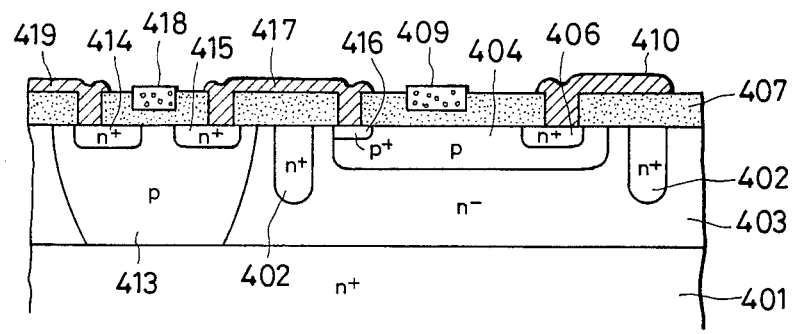
FIG. 9A is a schematic cross sectional view of a photoelectric converting cell having an n channel transistor for refreshing.
Figure 9B:
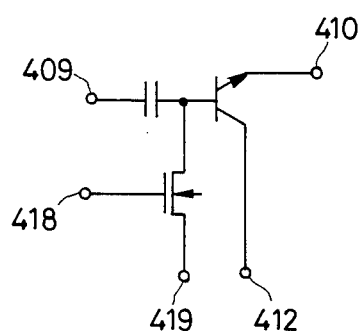
FIG. 9B is an equivalent circuit diagram of the cell in FIG. 9A.

FIG. 9A is a schematic cross sectional view of a photoelectric converting cell having an n channel refreshing transistor. FIG. 9B is an equivalent circuit diagram of this cell. The parts and components having the same functions as those shown in FIG. 7B are designated by the same reference numerals and their descriptions are omitted.

In the diagrams, a bipolar transistor for performing the photoelectric conversion which has already been explained is formed in the n⁻ region 403. Further, a p well 413 is formed through the device separating region 402.

n⁺ regions 414 and 415 serving as source and drain regions are formed in the p well 413. A gate electrode 418 is formed over the surface of the p well 413 through the oxide film 407. An n channel MOS transistor for refreshing is constructed.

A p⁺ region 416 is formed in the p base region 404 and electrically connected to the n⁺ region 415 of the refreshing transistor by a wiring 417. An electrode 419 connected to the n⁺ region 414 is also formed.

Figure 10:
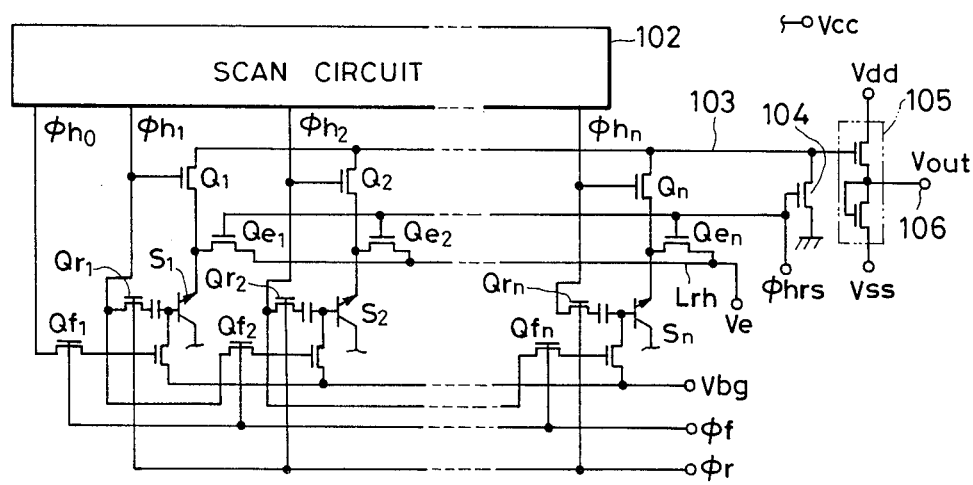
FIG. 10 is a schematic circuit diagram in the fifth embodiment of the invention using the above photoelectric converting cell.

FIG. 10 is a schematic circuit diagram in the fifth embodiment of the invention using the foregoing photoelectric converting cell.

This embodiment is configured in a manner similar to the fourth embodiment except that an n channel MOS transistor is used as a refreshing transistor of each cell. The fifth embodiment operates in a manner similar to the above by the various kinds of pulses shown in the timing chart of FIG. 8.

As described in detail above in the photoelectric converting apparatus according to the invention, at the timing for the refresh operation of the preceding cell, the control electrode region of the post cell is clamped to the constant potential. Therefore, the time intervals from the clamping operation until the refresh operation regarding all of the photoelectric converting cells are the same. Thus, the refresh operation conditions are equalized. The occurrence of the fixed pattern noise, the variation in sensitivity, and the like are prevented.

Figure 11:
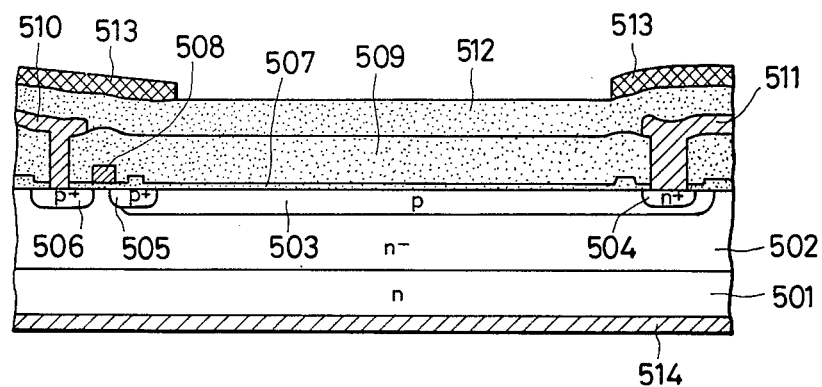
FIG. 11 is a cross sectional view of one cell in the sixth embodiment of the invention.

Next, FIG. 11 is a diagram showing the sixth embodiment of the invention. In the diagram, an n⁻ layer is formed on an n type substrate 501 by an epitaxial growth method. The cells $S_1$, $S_2$, ..., $S_n$ isolated from each other by a device separating region are formed in line on the n⁻ layer. The n⁻ layer serves as a collector region 502 in each cell.

Further, a p base region 503 is formed in each cell. An n⁺ emitter region 504 is formed in the phase region 503. In this manner, an npn type bipolar transistor is constructed.

A p⁺ region 505 is formed in the p base region 503. A p⁺ region 506 is formed in the n⁻ layer 502 with a constant distance away from the p⁺ region 505. Further, a gate electrode 508 is formed through an oxide film 507. In this manner, a resetting p channel MOS transistor (hereinafter, referred to as a "reset Tr") is constructed. An n channel MOS transistor may be also used as the reset Tr.

An insulative film 509 is formed on the bipolar transistor and reset Tr. An electrode 510 connected to the p⁺ region 506 and an emitter electrode 511 connected to the n⁺ emitter region 504 are formed, respectively. Further, an insulative film 512 is formed on the insulative film 509. The portion of the insulative film 512 excluding the opening portion is covered by a light shielding film 513.

In addition, a collector electrode 514 is formed on the back surface of the substrate 501.

In this embodiment, the case of the photoelectric converting cell using the npn type bipolar transistor has been described. However, the invention can be also applied to the system using a field effect transistor, an electrostatic inductive transistor, or the like. The invention can be applied to any system using a transistor having a region adapted to accumulate the carriers.

The fundamental operation of the photoelectric converting cell will now be explained.

Figure 12A:
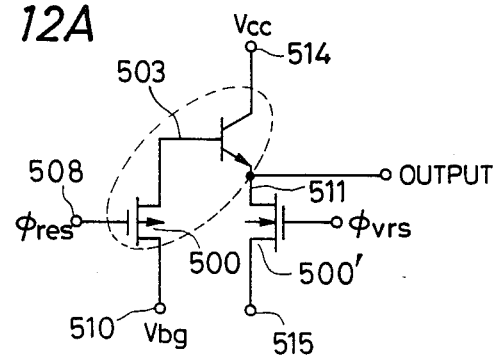
FIG. 12A is an equivalent circuit diagram for explaining the fundamental operation of the photoelectric converting cell shown in FIG. 11.
Figure 12B:
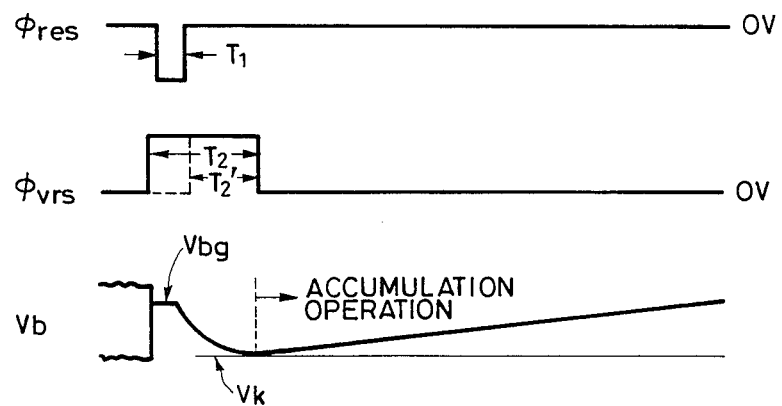
FIG. 12B is a voltage waveform diagram showing the operation of the cell shown in FIG. 11.

FIG. 12A is an equivalent circuit diagram for explaining the fundamental operation of the photoelectric converting cell. FIG. 12B is a voltage waveform diagram showing the operation of this cell.

In FIG. 12A, the foregoing photoelectric converting cell is equivalent to the circuit in which the p base region 503 of the npn type bipolar transistor is connected to a drain of a reset transistor 500.

A pulse $\phi_{res}$ is input to the gate electrode 508 of the reset transistor 500. A constant voltage $V_{bg}$ (e.g., 2V) is properly applied to the source electrode 510. The emitter electrode 511 is connected to a terminal 515 through an n channel MOS transistor 500'. A pulse $\phi_{vrs}$ is input to the gate electrode. A voltage which is sufficiently lower than the voltage $V_{bg}$ or a grounding voltage is properly applied to the terminal 515.

First, in the accumulation operation, the potential $V_b$ of the p base region 503 is set in the floating state at the initial positive potential and the emitter region 504 is set in the floating state of the zero potential, respectively.

The positive voltage $V_{cc}$ is applied to the collector electrode 514. The gate electrode 508 of the reset transistor 500 is set at the positive potential. The reset transistor 500 is in the off state.

In this state, the light enters the photo sensitive section. The carriers (in this case, the holes) of the amount corresponding to the light quantity are accumulated into the p base region 503.

At this time, since the p base region 503 is set at the initial positive potential, when the carriers are accumulated by the light excitation, the signals corresponding to the accumulated carriers are simultaneously read out to the emitter side in the floating state, so that the photoelectric converted output is derived. Namely, the readout operation is executed simultaneously with the accumulation operation in this case.

The operation to extinguish the carriers accumulated in the p base region 503 will now be explained.

As shown in FIG. 12B, by first applying the pulse $\phi_{res}$ of the negative voltage to the gate electrode 508 of the reset transistor 500, the reset transistor 500 is turned on (for the period of time $T_1$). Thus, the potential $V_b$ of the p base region 503 is set to the constant voltage $V_{bg}$ irrespective of the accumulated voltage level, namely, irrespective of the illuminance of the incident light.

The constant voltage $V_{bg}$ is set to a value which is sufficiently higher than a residual base potential $V_k$ after the carrier extinguishing operation was finished. For example, $V_{bg}=2V$.

Next, the transistor 500' is turned on by the pulse $\phi_{vrs}$ of the positive voltage. The grounding voltage of the terminal 515 or the voltage which is sufficiently lower than the voltage $V_{bg}$ is applied to the emitter electrode 511 through the transistor 500' (for the period of time $T_2$'). The pulse $\phi_{vrs}$ of the positive voltage can be also applied continuously after the time point when the pulse $\phi_{res}$ rose (for the period of time $T_2$).

Thus, the holes accumulated in the p base region 503 are recombined with the electrons which are implanted into the p base region 503 from the n+ emitter region 504, so that the holes are extinguished. As already explained above, the potential $V_b$ of the p base region 503 is set to the potential $V_{bg}$ which is sufficiently higher than the residual potential $V_k$ irrespective of the accumulated potential level for the period of time $T_1$. Therefore, after expiration of the period of time $T_2$ or $T_2'$, the potential $V_b$ of the p base region 503 is set to the constant potential $V_k$ irrespective of the illuminance of the incident light.

After expiration of the period $T_2$ or $T_2'$, the pulse $\phi_{vrs}$ falls and the transistors 500' is turned off. The emitter electrode 511 enters the floating state. Then, the foregoing accumulation operation and readout operation are executed.

In this manner, by providing the period of time $T_1$ to set the potential of the p base region 503 to the constant potential, at the end of the extinguishing operation for the period of time $T_2$ or $T_2'$, the potential $V_b$ of the p base region 503 can be set to the constant potential. The nonlinearity of the photoelectric converting characteristic in the low illuminance state and the phenomenon of the after image can be perfectly prevented. On the other hand, since the potential control of the p base region 503 is not performed by the capacitor, the reduction and variation in output due to the capacitor do not occur.

The seventh embodiment of the invention using the foregoing photoelectric converting cell will now be explained in detail hereinbelow with reference to the drawings.

Figure 13:
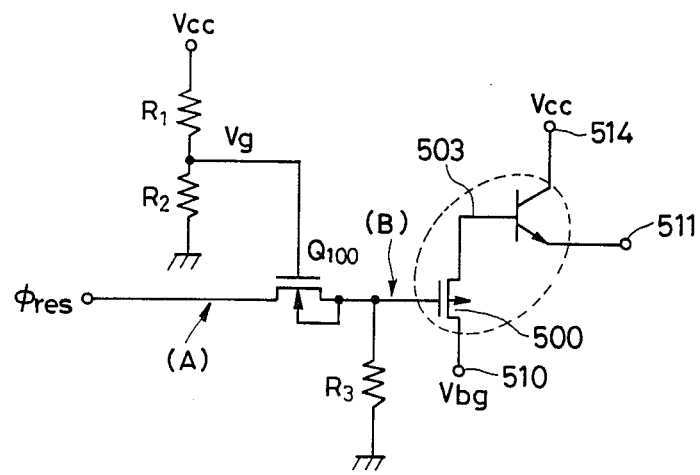
FIG. 13 is a schematic circuit diagram in the seventh embodiment of a photoelectric converting apparatus according to the invention.

FIG. 13 is a schematic circuit diagram in the seventh embodiment of a photoelectric converting apparatus according to the invention.

In the diagram, the constant positive voltage $V_{cc}$ is applied to the collector electrode 514 of the photoelectric converting cell. The foregoing output is derived from the emitter electrode 511.

The constant voltage $V_{bg}$ is applied to the source electrode 510 of the reset transistor 500. The gate electrode is grounded through a resistor $R_3$ and also connected to the source electrode of an n channel MOS transistor $Q_{100}$. The pulse $\phi_{res}$ is input to the drain electrode of this transistor.

The voltage $V_g$ obtained by dividing the voltage $V_{cc}$ by resistors $R_1$ and $R_2$ is applied to the gate electrode of the transistor $Q_{100}$.

The value of the gate voltage $V_g$ is decided by the relation with the drain voltage. In this case, the gate voltage $V_g$ is set in a manner such that the transistor $Q_{100}$ is made conductive in the unsaturation region when the pulse $\phi_{res}$ is at the low voltage and that the transistor $Q_{100}$ is set to the pinch-off state or saturated state in the drain when the pulse $\phi_{res}$ is at the high voltage.

In the above circuit, the voltage at point (A) as the drain voltage of the transistor $Q_{100}$ is set to V(A) and the voltage at point (B) as the gate voltage of the reset transistor 500 is set to V(B).

The operation of the seventh embodiment will now be described.

Figure 14:
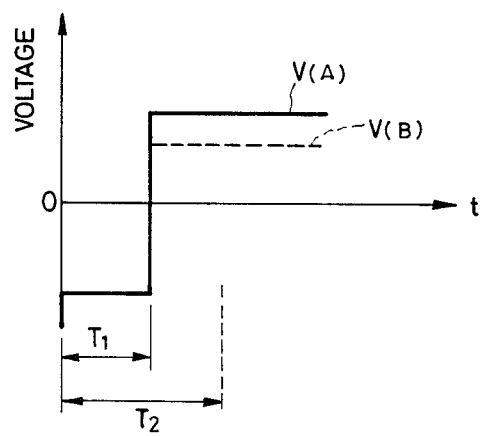
FIG. 14 is a graph showing the relation between the voltages V(A) and V(B) in the embodiment.
Figure 15:
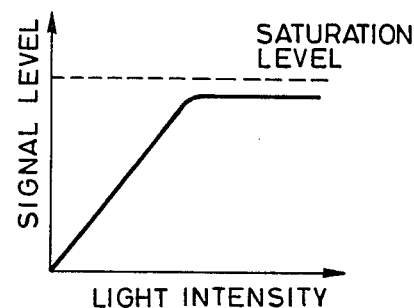
FIG. 15 is a graph schematically showing the photoelectric converting characteristic in the embodiment.

FIG. 14 is a graph showing the relation between the voltages V(A) and V(B) in this embodiment. FIG. 15 is a graph schematically showing the photoelectric converting characteristic in the embodiment.

First, in FIG. 14, in the refresh operation of the photoelectric converting cell, the voltage V(A) falls by the pulse $\phi_{res}$ and is set to the negative potential for only the period of time $T_1$. Thus, the transistor $Q_{100}$ is turned on in the unsaturation region as mentioned above. The gate voltage V(B) of the reset transistor 500 is almost equal to the voltage V(A).

Therefore, the reset transistor 500 as the p channel MOS transistor is turned on. The voltage $V_b$ of the p base region 503 is set to the constant voltage $V_{bg}$ irrespective of the light quantity of the incident light as already explained above.

After the elapse of the period of time $T_1$, the voltage V(A) rises to a predetermined positive potential, so that the transistor $Q_{100}$ enters the saturated state. Since the gate voltage $V_g$ is constant so long as the voltage $V_{cc}$ is constant, an almost constant drain-source current flows through the transistor $Q_{100}$. The gate voltage V(B) of the reset transistor 500 is set to the constant positive voltage which is lower than the voltage V(A) by the resistor $R_3$. $V(B)=V_g-V_{t1}$ (where, $V_{t1}$ denotes a threshold voltage of the transistor $Q_{100}$). In this embodiment, V(B) is set to be lower than $V_{cc}$ from the relation with the reset transistor 500, which will be explained hereinafter.

The reset transistor 500 is turned off by the constant gate voltage V(B) and the refresh operation is executed until the period of time $T_2$ has passed as already explained above. Subsequently, the accumulation operation and readout operation are performed.

Assuming that the threshold voltage of the reset transistor 500 is $V_{t5}$, although the reset transistor 500 is in the off state in this embodiment, when the potential $V_b$ of the p base region 503 reaches a constant potential $V_{bm}$ due to the accumulation, the reset transistor 500 is made conductive. The base potential $V_b$ is always limited to a value of the constant potential $V_{bm}$ or less. Contrarily speaking, the value of the gate voltage V(B) of the reset transistor 500 is set so as to limit the base potential within $V_{bm}$.

Namely, with an increase in base potential $V_b$, the drain-gate voltage (V(B)−$V_b$) of the reset transistor 500 decreases. By setting the gate voltage V(B) so that the pinch-off state in the drain occurs when $V_b = V_{bm}$, the reset transistor 500 is made conductive when $V_b = V_{bm}$. The base potential does not increase to a value of $V_{bm}$ or more. At this time, $V_{bm} = V(B) + V_{t5}$.

Since the constant potential $V_{bm}$ is set to a potential lower than the saturation potential at which the carriers accumulated in the p base region 503 flow out, even if the strong light enters, the leakage of the carriers into the adjacent cells can be prevented. In addition, the outflow of the carriers to the emitter side can be also prevented.

By setting the upper limit of the base potential as explained above, the output characteristic in this embodiment has reached the upper limit before the output signal level reaches the saturation level as shown in FIG. 15. However, by properly selecting the upper limit level, no practical problem occurs.

In this embodiment, the gate voltage $V_g$ of the transistor $Q_{100}$ is obtained by the voltage $V_{cc}$ serving as not only the collector voltage of the bipolar transistor but also the substrate voltage of the reset transistor 500. Therefore, there is an advantage such that even if the voltage $V_{cc}$ fluctuated, the influence on the photoelectric converting cell is set off.

Figure 16:
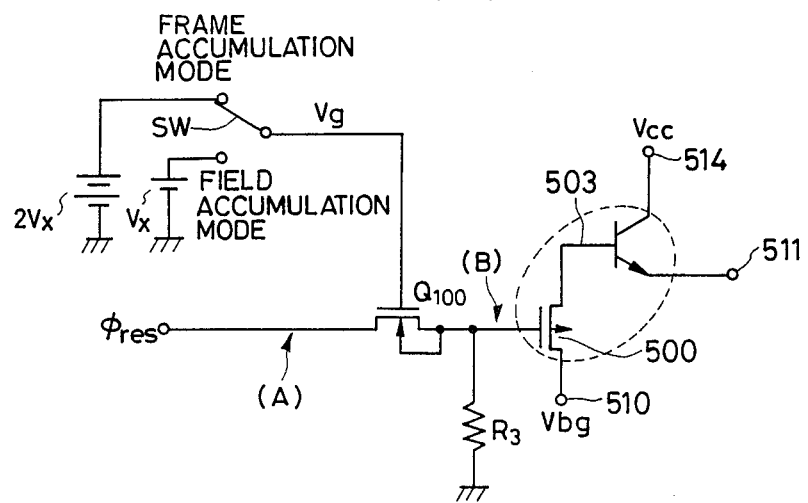
FIG. 16 is a schematic circuit diagram in the eighth embodiment of the invention.

FIG. 16 is a schematic circuit diagram in the eighth embodiment of the invention.

This embodiment has a switch SW to switch the gate voltage $V_g$ of the transistor $Q_{100}$.

For example, in the photoelectric converting apparatus in which the photoelectric converting cells are arranged like an area, two operation modes are provided: the field accumulation mode to form a one horizontal line signal by simultaneously reading out the signals of the cells of two lines and by adding them; and the frame accumulation mode to form a one horizontal line signal by reading out the signals of the cells of one line.

In the field accumulation mode, even if the signal level per cell is the half of that in the frame accumulation mode, the horizontal signal at the equal level is eventually obtained. Therefore, in this example, as shown in FIG. 16, the gate voltage $V_g$ in the field accumulation mode is set to a lower value (about the half of that in the frame accumulation mode). Thus, the gate voltage V(B) of the reset transistor 500 also becomes the low value, so that the potential $V_b$ of the p base region 503 can reach to the upper limit at a low level. The occurrence of the smear can be effectively prevented.

Figure 17:
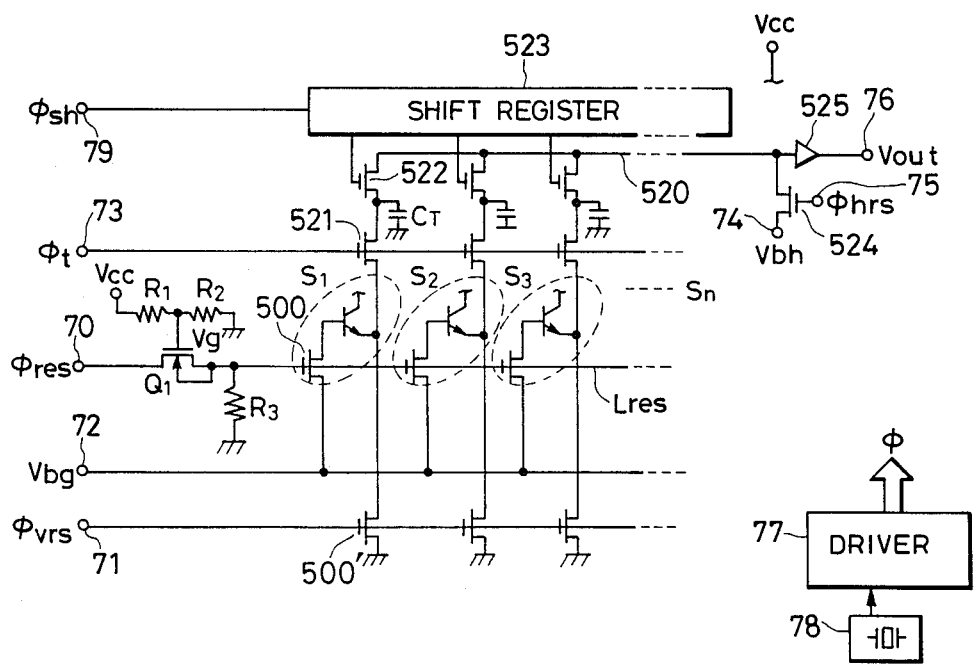
FIG. 17 is a schematic circuit diagram of a line sensor using the apparatus in the seventh embodiment.

FIG. 17 is a schematic circuit diagram of a line sensor using the photoelectric converting cells in the seventh embodiment.

In this diagram, the gate electrode 508 of the reset transistor 500 of each cell is commonly connected to a line $L_{res}$. The line $L_{res}$ is grounded through the resistor $R_3$ and also connected to a terminal 70 through the transistor $Q_{100}$. The pulse $\phi_{res}$ is input to the terminal 70. The voltage $V_g$ is applied to the gate electrode of the transistor $Q_{100}$. This gate voltage $V_g$ is obtained by dividing the voltage $V_{cc}$ by the resistors $R_1$ and $R_2$.

The source electrode 510 of each reset transistor 500 is commonly connected to a terminal 72. The voltage $V_{bg}$ is applied to the terminal 72.

The emitter electrode 511 of each cell is grounded through the transistor 500′. The gate electrodes of the transistors 500′ are commonly connected to a terminal 71. The pulse $\phi_{vrs}$ is input to the terminal 71.

Further, the emitter electrode 511 of each cell is connected to an accumulating capacitor $C_T$ through a transistor 521. Each capacitor $C_T$ is commonly connected to an output line 520 through a transistor 522, respectively.

The gate electrodes of the transistors 521 are commonly connected to a terminal 73. A pulse $\phi_t$ is applied to the terminal 73.

The gate electrode of the transistor 522 is connected to an output terminal of a shift register 523. The transistors 522 are sequentially turned on by the shift register 523. The shift registers 523 are made operative by a shift pulse $\phi_{sh}$ which are input from a terminal 79. The positions at the high level are sequentially shifted.

The output line 520 is connected to an output terminal 76 through an output amplifier 525. An input terminal of the output amplifier 525 is also connected to a terminal 74 through a transistor 524. A constant voltage $V_{bh}$ is applied to the terminal 74. On the other hand, the pulse $\phi_{hrs}$ is input to a gate electrode 75 of the transistor 524.

The pulses $\phi$ and constant voltages $V_{bg}$ and $V_{bh}$ are supplied from a driver 77. The driver 77 outputs the pulses at the timings responsive to a clock signal from an oscillator 78.

The operation of the foregoing line sensor will now be explained hereinbelow with reference to FIG. 18.

Figure 18:
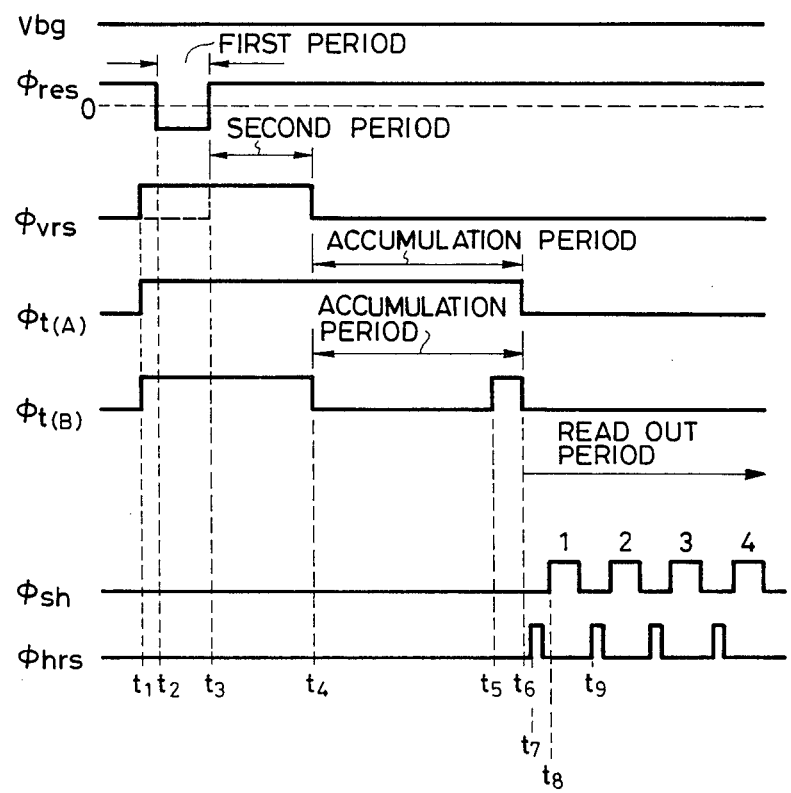
FIG. 18 is a timing chart showing an example of timings for respective pulses which are output from a driver 77 shown in FIG. 17.

FIG. 18 is a timing chart showing an example of the timings for the pulses which are generated from the driver 77. In the diagram, $\phi_t(A)$ and $\phi_t(B)$ indicate timings for the different reading methods.

The case of the pulse $\phi_t(A)$ will be first explained.

By setting the pulse $\phi_{res}$ to the low level at time $t_2$ after the pulses $\phi_t$ and $\phi_{vrs}$ was set to the high level at time $t_1$, all of the reset transistors 500 are turned on as mentioned above. The potential of the p base region 503 of each cell is set to the constant potential $V_{bg}$.

On the other hand, since the pulse $\phi_t$ is at the high level, the transistor 521 is turned on and the charges in the capacitor $C_T$ are eliminated through the transistors 521 and 500′.

When the pulse $\phi_{res}$ is set to the high level at time $t_3$, the reset transistor 500 of each cell is turned off. Since the pulse $\phi_{vrs}$ is still at the high level, the carriers accumulated in the p base region are gradually recombined with the electrons and extinguished as already mentioned above. The amounts of residual carriers in the p base regions of all cells at time $t_4$ are always equal irrespective of the quantity of residual carriers in the p base regions before time $t_2$.

When the pulse $\phi vrs$ falls at time $t_4$, the emitter electrode 511 of each cell is connected to the capacitor $C_T$ through the transistor 521. The accumulation and readout operations are executed until the pulse $\phi_t$ falls at time $t_6$ as mentioned above. Namely, as the carriers generated by the light excitation in the cells $S_1$ to $S_n$ are accumulated in the p base regions, the carriers as much as the accumulated carriers are accumulated into the capacitors $C_T$, respectively. At this time, even if intense light entered, the base potential of each cell is limited to a value within the constant value by each reset transistor 500, so that the outflow of the excess carriers is prevented.

When the pulse $\phi_t$ falls at time $t_6$, the transistors 521 are turned off. The photoelectrically converted signals in the cells $S_1$ to $S_n$ are accumulated in the capacitors $C_T$ and stored.

Next, the operations to sequentially take out the information stored in the capacitors $C_T$ and to serially output them are executed.

First, by applying one pulse $\phi_{hrs}$ at time $t_7$, the transistor 524 is turned on and the residual charges in the stray capacitor of the output line 520 are eliminated.

By subsequently applying one pulse $\phi_{sh}$ at time $t_8$, the scan of each transistor 522 by the shift register 523 is started.

When one of the transistors 522 is turned on, the charges accumulated in the relevant capacitor $C_T$ are taken out to the output line 520 and output to the outside from the output terminal 76 through the amplifier 525. Thereafter, the transistor 524 is immediately turned on by the pulse $\phi_{hrs}$ and the output line 520 is cleared.

The foregoing signal fetching operations are sequentially executed at the timings of the shift pulses $\phi_{sh}$ with respect to the cells $S_1$ to $S_n$. The signals which were photoelectrically converted for the period of time from time $t_4$ to time $t_6$ and the dark reference signal can be sequentially output.

After all of the signals accumulated in the capacitors $C_T$ were taken out, the carrier extinguishing operation for the period of time from $t_1$ to $t_4$, the accumulation and readout operations for the period of time from $t_4$ to $t_6$, and the signal taking-out operation after time $t_7$ are again repeated in accordance with this order.

The readout operation in the case of the pulse $\phi_t(B)$ relates to the further improved operation of the operation in the case of pulse $\phi_t(A)$.

Namely, the pulses $\phi_t$ are set to the low level for the period of time from $t_4$ to $t_5$. Thus, the carriers generated in the p base region of each cell by the light excitation are not accumulated in the capacitor $C_T$ but accumulated in each cell. The signals accumulated in each cell by the pulses $\phi_t$ for the period of time from $t_5$ to $t_6$ are transferred to the capacitor $C_T$, respectively. With this method, it has been confirmed by the experiments that as compared with the case of $\phi_t(A)$, the output was improved by 20 to 30% and the variation in sensitivity was remarkably reduced.

Although the pulse $\phi_{vrs}$ is set to the high level for the period of time from $t_1$ to $t_3$, it may be set to the low level. In this case, the current flowing across the base and emitter of the cell for the period of time from $t_1$ to $t_3$ can be shut off. The loss of electric power can be effectively prevented.

Each signal of the cells $S_1$ to $S_n$ are serially output as the output signal $V_{out}$ from the terminal 76 of the amplifier 525 to the outside.

In the foregoing line sensor, even if the strong light entered, the carriers do not leak to the adjacent cells, so that the smear can be prevented.

According to this embodiment, the similar effects can be also obtained by forming an area sensor. In this case, the smear can be further effectively prevented by use of the cells in the eighth embodiment of the invention.

As described in detail above, in the photoelectric converting apparatuses in the seventh and eighth embodiments of the invention, the potential of the control electrode region of the photoelectric converting transistor is always limited to a value within the constant potential before it reaches the saturation potential. Therefore, the outflow of the carriers which will occur when the potential of the control electrode region has reached the saturation potential does not occur. The leakage of the carriers to the adjacent devices can be prevented. Therefore, when constituting a line sensor or an area sensor, the occurrence of the smear can be effectively prevented by merely providing the carrier eliminating means with a simple constitution.

What is claimed is:

1. A photoelectric converting apparatus comprising:
   a voltage source;
   a photoelectric converting cell comprising a semiconductor transistor which includes a control electrode region and plural main electrode regions, wherein by controlling a potential of said control electrode region, carriers generated in said control electrode region by a light excitation are accumulated, and an accumulated voltage generated by such carrier accumulation is read out from one of said main electrode regions; and
   excess carrier eliminating means, connected between said voltage source and said control electrode region, for conducting charge carriers in response to a potential difference between said voltage source and said control electrode region.

2. An apparatus according to claim 1, wherein said excess carrier eliminating means consists of a potential barrier depending on the potential difference across the excess carrier eliminating means.

3. An apparatus according to claim 2, wherein said excess carrier eliminating means comprises a PN junction.

4. An apparatus according to claim 3, wherein a PN junction diode is connected to each one of said main electrode regions.

5. An apparatus according to claim 3, wherein said PN junction consists of a semiconductor region formed in said control electrode region separately from each of said main electrode regions, and said semiconductor region comprises a conductivity type opposite to that of said control electrode region.

6. An apparatus according to claim 1, wherein said excess carrier eliminating means comprises a transistor which is properly made conductive.

7. An apparatus according to claim 1, wherein a plurality of such photoelectric converting cells are provided and constitute a row.

8. An apparatus according to claim 1, further having clearing means for clearing the carriers in said control electrode region of said photoelectric converting cell.

9. An apparatus according to claim 8, wherein a plurality of said photoelectric converting cells are provided and constitute a row.

10. An apparatus according to claim 9, wherein said clearing means sequentially clears the carriers in said control electrode regions of each of said plurality of photoelectric converting cells, respectfully.

11. A photoelectric converting apparatus comprising:
    a plurality of photoelectric converting cells each including a semiconductor transistor;
    switching means for clamping a potential of a control electrode region of said semiconductor transistor to a constant value; and
    control means for performing an accumulation operation to accumulate carriers generated in the control electrode region by a light excitation by controlling the potential of the control electrode region, a readout operation to read out an accumulated voltage generated by said carrier accumulation, a clamping operation to clamp the potential of the control electrode region to a constant potential by said switching means, and a refresh operation to extinguish the carriers in the control electrode region after completion of said clamping operation, and for controlling the switching means of a predetermined one of said plurality of photoelectric converting cells synchronously with a refresh operation timing of another cell different from said predetermined cell, thereby clamping the potential of the control electrode region of said predetermined cell to the constant value.

12. An apparatus according to claim 11, wherein said semiconductor transistor comprises a bipolar transistor.

13. An apparatus according to claim 11, wherein said switching means includes an MOS transistor.

14. An apparatus according to claim 11, wherein said control means extinguishes the carriers by applying predetermined pulses to said control electrode region.

15. An apparatus according to claim 11, wherein said control means executes the readout operation by sequentially reading out the accumulated voltages from said plurality of photoelectric converting cells in accordance with a predetermined order.

16. An apparatus according to claim 15, wherein said control means executes the refresh operation by sequentially refreshing said plurality of photoelectric converting cells in accordance with said predetermined order.

17. An apparatus according to claim 11, wherein said semiconductor transistor comprises a first main electrode region connected to a predetermined potential and a second main electrode region connected to a load.

18. An apparatus according to claim 17, further comprising excess carrier eliminating means, connected to said second main electrode region, for performing a switching operation in accordance with a potential difference across said excess carrier eliminating means.

19. An apparatus according to claim 18, wherein said excess carrier eliminating means comprises a transistor.

20. An apparatus according to claim 19, further comprising means for selectively making said transistor operative so as to selectively make said excess carrier eliminating means operative.

21. A photoelectric converting apparatus comprising:
a plurality of photoelectric converting transistors each comprising a respective control electrode region to accumulate carriers generated by a light excitation;
carrier eliminating means for limiting a potential of each said control electrode region to a value within a predetermined potential lower than a saturation potential; and
control means for controlling the value in accordance with a reading operation of the accumulated carriers.

22. An apparatus according to claim 21, further comprising a plurality of main electrodes, wherein said carrier eliminating means comprises a switching transistor and one of said plurality of main electrodes of said switching transistor is connected to said control electrode region and
wherein a voltage of another of said main electrodes of said switching transistor and a voltage of a control electrode thereof are set in a manner such that the potential of said control electrode region of one of said photoelectric converting transistors is limited to a value within the predetermined potential.

23. An apparatus according to claim 21, wherein said photoelectric converting transistor comprises a bipolar transistor.

24. An apparatus according to claim 21, wherein said photoelectric converting transistor constitutes an area sensor consisting of a plurality of rows and a plurality of columns.

25. An apparatus according to claim 24, further comprising control means comprising:
a first mode to simultaneously read out said photoelectric converting transistors of a predetermined plurality of rows of said area sensor, thereby forming signals of one horizontal lines; and
a second mode to read out said photoelectric converting transistors of one predetermined row of said area sensor, thereby forming signals of one horizontal line.

26. An apparatus according to claim 25, further comprising means for changing the characteristics of said carrier eliminating means in accordance with the switching between said first and second modes.

27. An apparatus according to claim 26, wherein the changing means switches said predetermined potential in said carrier eliminating means.

28. An image pickup apparatus comprising:
(a) an area sensor comprising a plurality of photoelectric converting cells consisting of rows and columns;
(b) readout control means selectively having a first mode to simultaneously read out the photoelectric converting cells of a predetermined plurality of rows of said area sensor and thereby to form signals of one horizontal line and a second mode to read out the photoelectric converting cells of one predetermined row of said area sensor and thereby to form signals of one horizontal line; and
(c) saturation level control means for changing a saturation level of each of said photoelectric converting cells in accordance with either the first or second mode selected by said control means.

29. An apparatus according to claim 28, wherein said saturation level control means has a semiconductor element to lead the signal exceeding a predetermined level in the signals accumulated in each of said photoelectric converting cells to a predetermined potential.

30. An apparatus according to claim 29, wherein said semiconductor element comprises a transistor.

31. An apparatus according to claim 29, wherein said semiconductor element is made conductive when the signals accumulated in each of said photoelectric converting cells exceed a predetermined level.

32. An apparatus according to claim 28, wherein each of said photoelectric converting cells comprises a bipolar transistor.

* * * * *

UNITED STATES PATENT AND TRADEMARK OFFICE
CERTIFICATE OF CORRECTION

PATENT NO. : 4,866,293
DATED : September 12, 1989
INVENTOR(S) : YOSHIO NAKAMURA ET AL.

It is certified that error appears in the above-identified patent and that said Letters Patent is hereby corrected as shown below:

COLUMN 1

Line 15, "cross sectional" should read --cross-sectional--.

COLUMN 2

Line 54, "t" should read --to--.

COLUMN 3

Line 34, "cross sectional" should read --cross-sectional--.
    Line 49, "cross sectional" should read --cross-sectional--.
    Line 51, "a" should read --an--.
    Line 61, "cross sectional" should read --cross-sectional--.

COLUMN 4

Line 3, "cross sectional" should read --cross-sectional--.
    Line 11, "cross sectional" should read --cross-sectional--.

COLUMN 6

Line 9, "smear" should read --smearing--.
    Line 46, "cross sectional" should read --cross-sectional--.
    Line 66, "photo sensitive" should read --photosensitive--.

UNITED STATES PATENT AND TRADEMARK OFFICE
CERTIFICATE OF CORRECTION

PATENT NO. : 4,866,293

DATED : September 12, 1989

INVENTOR(S) : YOSHIO NAKAMURA ET AL.

It is certified that error appears in the above-identified patent and that said Letters Patent is hereby corrected as shown below:

COLUMN 7

Line 2, "photo sensitive" should read --photosensitive--.
    Line 59, "smear" should read --smearing--.
    Line 67, "smear" should read --smearing--.

COLUMN 8

Line 6, "cross sectional" should read --cross-sectional--.

COLUMN 9

Line 24, "respectively. A" should read --respectively. ¶ A--.

COLUMN 10

Line 54, "smear" should read --smearing--.

COLUMN 11

Line 38, "cross sectional" should read --cross-sectional--.

COLUMN 12

Line 1, "above in" should read --above, in--.
    Line 19, "phase region 503." should read --p base region 503.--.

UNITED STATES PATENT AND TRADEMARK OFFICE
CERTIFICATE OF CORRECTION

PATENT NO. : 4,866,293

DATED : September 12, 1989

INVENTOR(S) : YOSHIO NAKAMURA ET AL.

It is certified that error appears in the above-identified patent and that said Letters Patent is hereby corrected as shown below:

COLUMN 13

Line 5, "photo sensitive" should read --photosensitive--.
    Line 52, "transistors 500'" should read --transistor 500'--.

COLUMN 15

Line 58, "smear" should read --smearing--.

column 16

Line 43, "was" should read --were--.
    Line 60, "pulse $\phi$vrs" should read --pulse $\phi_{vrs}$--.

COLUMN 17

Line 61, "smear" should read --smearing--.
    Line 64, "smear" should read --smearing--.

COLUMN 18

Line 9, "smear" should read --smearing--.
    Line 60, "respectfully." should read --respectively.--.

UNITED STATES PATENT AND TRADEMARK OFFICE
CERTIFICATE OF CORRECTION

PATENT NO. : 4,866,293

DATED : September 12, 1989

INVENTOR(S) : YOSHIO NAKAMURA ET AL.

It is certified that error appears in the above-identified patent and that said Letters Patent is hereby corrected as shown below:

COLUMN 20

```
Line 2,  "region and" should read --region, and--.
Line 21, "one horizontal lines;" should read
         --one horizontal line;--.
Line 30, "the" should read --said--.
Line 31, "said" should read --the--.
Line 51, "lead" should read --set--.
```

Signed and Sealed this

Twenty-ninth Day of September, 1992

Attest:

DOUGLAS B. COMER

*Attesting Officer*     *Acting Commissioner of Patents and Trademarks*